United States Patent
Koyanagi et al.

(10) Patent No.: US 6,525,415 B2
(45) Date of Patent: Feb. 25, 2003

(54) THREE-DIMENSIONAL SEMICONDUCTOR INTEGRATED CIRCUIT APPARATUS AND MANUFACTURING METHOD THEREFOR

(75) Inventors: Mitsumasa Koyanagi, Natori (JP); Yasunori Okano, Nakai-machi (JP); Nobuaki Miyakawa, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 21 days.

(21) Appl. No.: 09/745,874

(22) Filed: Dec. 26, 2000

(65) Prior Publication Data
US 2001/0005059 A1 Jun. 28, 2001

(30) Foreign Application Priority Data
Dec. 28, 1999 (JP) .......................... 11-375619
Dec. 28, 1999 (JP) .......................... 11-375653

(51) Int. Cl.[7] .............................. H01L 23/02
(52) U.S. Cl. ....................... 257/686; 257/700
(58) Field of Search ................. 257/778, 758, 257/735, 734, 700, 686, 621

(56) References Cited

U.S. PATENT DOCUMENTS 5,753,536 A * 5/1998 Sugiyama et al. .......... 438/108
5,902,118 A * 5/1999 Hubner ...................... 408/107
6,322,903 B1 * 11/2001 Siniaguine et al. ......... 428/617

FOREIGN PATENT DOCUMENTS

JP          6-260594          9/1994

* cited by examiner

Primary Examiner—William David Coleman
(74) Attorney, Agent, or Firm—Oliff & Berridge PLC

(57) ABSTRACT

A three-dimensional semiconductor integrated circuit apparatus which permits ready electrical connection and is resistant to deformation and easy to fabricate and a manufacturing method therefor are provided. A second semiconductor substrate is stacked over a third semiconductor substrate, and a first semiconductor substrate is stacked over the second semiconductor substrate. A second integrated circuit is formed over the surface layer of the second semiconductor substrate, and the integrated circuit side of the second semiconductor substrate is bonded to the integrated circuit side of the first semiconductor substrate, resulting in the electrical connection of the first integrated circuit formed over the surface layer of the first semiconductor substrate and the second integrated circuit. In the second semiconductor substrate is formed embedded wiring of which one end is electrically connected to the second integrated circuit and the other end is exposed from the back side, and the third integrated circuit formed over the surface layer of the third semiconductor substrate and the second integrated circuit are electrically connected to the embedded wiring.

3 Claims, 6 Drawing Sheets

THREE-DIMENSIONAL SEMICONDUCTOR INTEGRATED CIRCUIT APPARATUS AND MANUFACTURING METHOD THEREFOR

BACKGROUND OF THE INVENTION

1. Field of the Invention

The present invention relates to a three-dimensional semiconductor integrated circuit apparatus and a manufacturing method therefor.

2. Description of the Related Art

In recent years, attempts have been made to develop three-dimensional semiconductor integrated circuit apparatuses by integrating plural circuit functional blocks three-dimensionally with a view to producing semiconductor integrated circuit apparatuses on a larger scale of integration and in higher density. At first, the possibility of manufacturing three-dimensional semiconductor integrated circuit apparatuses by monolithic technology utilizing "silicon on insulator" (SOI) techniques through laser recrystallization and otherwise to repeat SOI substrate formation and the formation of semiconductor apparatuses over the SOI substrates so prepared. However, stacking many SOI layers involves the problems of the difficulty to secure a satisfactory level of crystallinity and a long manufacturing time.

For this reason, many ways to manufacture three-dimensional semiconductor integrated circuit apparatuses are under study, such as bonding together monocrystalline semiconductor substrates over which semiconductor integrated circuit apparatus are fabricated in advance.

In an article by Yoshihiro Hayashi et al. in the September 1990 issue of the monthly *Semiconductor World*, pp. 58–64 (in Japanese), as a bonding technique, a CUBIC method is proposed by which semiconductor substrates ground into thin films are bonded together. According to the CUBIC technique, after a first semiconductor substrate having a semiconductor element formed over a silicon substrate is bonded to a supporting substrate, superfluous parts of the silicon substrate are polished off to obtain a thin film. Then, wiring lines needed for the connection of devices including contact members, such as embedded wiring, back side wiring and bump/pools, and the first semiconductor substrate and a second semiconductor substrate having a semiconductor element formed over a silicon substrate are bonded together. Finally, the supporting substrate is removed to finish the intended semiconductor of a multi-layered structure.

Another instance is a three-dimensional semiconductor integrated circuit apparatus formed by a bonding technique, disclosed in the Japanese Published Unexamined Patent Application No. Hei 6-260594. This process begins with similar steps to those of the CUBIC technique, i.e. a first semiconductor substrate having a semiconductor element formed over a silicon substrate is bonded to a supporting substrate, and superfluous parts of the silicon substrate are polished off to obtain a thin film, but it is different in that a trench for embedded wiring is provided in the first semiconductor substrate in advance and that the first semiconductor substrate and a second semiconductor substrate having a semiconductor element formed over a silicon substrate are bonded together, followed by removal of the supporting substrate and formation of embedded wiring.

However, both of these manufacturing processes involve the steps of bonding the first semiconductor substrate to the supporting substrate and to remove the supporting substrate after polishing, resulting in troublesome complexity.

The CUBIC technique involves its own problem that, because the supporting substrate is removed after superfluous parts of the silicon substrate are polished off to obtain a thin film, the integrated circuit formed over the semiconductor substrate is apt to be damaged when the supporting substrate is removed.

Furthermore, the technique disclosed in Japanese Published Unexamined Patent Application No. Hei 6-260594 is subject to a problem that, since the first semiconductor substrate in which a trench for embedded wiring is provided in advance is bonded to the supporting substrate, the adhesive having found its way deep into the trench is difficult to remove and another problem that, because an insulating film is formed by oxidizing the side walls of the trench after the first semiconductor substrate and the second semiconductor substrate are bonded together, the oxidization temperature cannot be raised beyond a level that the adhesive can withstand, making it impossible to form a reliable insulating film.

SUMMARY OF THE INVENTION

Therefore, the present invention is intended to provide a three-dimensional semiconductor integrated circuit apparatus which permits ready electrical connection and is highly resistant to deformation. The invention is also intended to provide a manufacturing method for three-dimensional semiconductor integrated circuit apparatuses, which requires no step to mount or dismount a supporting substrate, thereby simplifying the manufacturing process substantially, and permits stacking of multi-layered semiconductor substrates in a simple and easy process and formation of embedded wiring surrounded by a reliable insulating layer.

In order to realize these intentions, according to a first aspect of the invention, there is provided a three-dimensional semiconductor integrated circuit apparatus having a first semiconductor substrate over whose surface layer is formed a first integrated circuit; a second semiconductor substrate over whose surface layer are formed a second integrated circuit and embedded wiring of which one end is electrically connected to the second integrated circuit and the other end is exposed from the back side, and whose integrated circuit side is bonded to the integrated circuit side of the first integrated circuit so that the first integrated circuit and the second integrated circuit be electrically connected; and a third semiconductor substrate over whose surface layer is formed a third integrated circuit and whose integrated circuit side is bonded to the back side of the second integrated circuit so that the third integrated circuit be electrically connected to the other end of the embedded wiring.

This three-dimensional semiconductor integrated circuit apparatus according to the first aspect of the invention, since its first semiconductor substrate and second semiconductor substrate are bonded together with their respective integrated circuit sides positioned opposite to each other, permits ready electrical connection, and its good symmetry effectively prevents the substrates from deformation such as warping. Moreover, as the embedded wiring penetrates the substrate, the substrate can be made reasonably thick.

According to a second aspect of the invention, there is provided a three-dimensional semiconductor integrated circuit apparatus having a first semiconductor substrate over whose surface layer is formed a first integrated circuit; a second semiconductor substrate over whose surface layer are formed a second integrated circuit and embedded wiring of which one end is electrically connected to the second integrated circuit and the other end is exposed from the back side, and whose integrated circuit side is bonded to the integrated circuit side of the first integrated circuit so that the first integrated circuit and the second integrated circuit be electrically connected; and a third semiconductor substrate over whose surface layer are formed a third integrated circuit and embedded wiring of which one end is electrically connected to the third integrated circuit and the other end is exposed from the back side, and whose integrated circuit side is bonded to the back side of the second integrated circuit so that the third integrated circuit be electrically connected to the other end of the embedded wiring of the second semiconductor substrate.

This three-dimensional semiconductor integrated circuit apparatus according to the second aspect of the invention, as embedded wiring is formed in the third semiconductor substrate, makes it possible to manufacture a four-layered three-dimensional semiconductor integrated circuit apparatus by further grinding the back side of the third semiconductor substrate to expose the embedded wiring and by bonding a fourth semiconductor substrate to the back side of the third semiconductor substrate so that the integrated circuit side of the fourth semiconductor substrate over whose surface layer is formed a fourth integrated circuit be electrically connected to the exposed part of the embedded wiring. Further, it is possible to manufacture a three-dimensional semiconductor integrated circuit apparatus of a structure having five or more layers by repeating the same process.

It is possible to electrically connect the other ends of the embedded wiring between the first integrated circuit and the second integrated circuit and between the third integrated circuit and the second semiconductor substrate via contact members such as micro-bumps.

The electrical connection of the other ends of the embedded wiring between the first integrated circuit and the second integrated circuit and between the third integrated circuit and the second semiconductor substrate can be readily accomplished by using contact members such as micro-bumps.

By a first manufacturing method for three-dimensional semiconductor integrated circuit apparatuses according to another aspect of the present invention, a first semiconductor substrate over whose surface layer is formed a first integrated circuit and a second semiconductor substrate over whose surface layer are formed a second integrated circuit and embedded wiring electrically connected to the second integrated circuit are bonded together with their respective integrated circuit sides positioned opposite to each other so that the first integrated circuit and the second integrated circuit be electrically connected; the back side of the second semiconductor substrate is grounded to expose the embedded wiring; and the integrated circuit side of a third semiconductor substrate over whose surface layer is formed a third integrated circuit is connected to the back side of the second semiconductor substrate so that the third integrated circuit be electrically connected to the exposed part of the embedded wiring.

In this first manufacturing method for three-dimensional semiconductor integrated circuit apparatuses according to the invention, as it enables without having to use a supporting substrate or the like a first semiconductor substrate over whose surface layer is formed a first integrated circuit and a second semiconductor substrate over whose surface layer are formed a second integrated circuit and embedded wiring electrically connected to the second integrated circuit to be directly bonded together with their respective integrated circuit sides positioned opposite to each other so that the first integrated circuit and the second integrated circuit be electrically connected, a step of bonding the substrate to a supporting substrate and one of removing them from the supporting substrate is dispensed with, making it possible to substantially simplify the manufacturing process.

Moreover, as many semiconductor substrate layers as desired can be stacked one over another in such a simple and easy process of repetitive alternation of grinding and bonding that the embedded wiring is exposed on the surface layer by grinding the back side of the second semiconductor substrate, and the integrated circuit side surface of the third semiconductor substrate over whose surface layer is formed the third integrated circuit is bonded to the back side of the second semiconductor substrate so that the third integrated circuit be electrically connected to the exposed part of the embedded wiring.

It is further possible to form a reliable insulating film because semiconductor substrates are bonded after the formation of embedded wiring.

It is preferable that the second semiconductor substrate be a silicon substrate having an insulating layer made up of silicon dioxide inside and the back side of the second semiconductor substrate be ground to the insulating layer to expose the embedded wiring.

The use of an insulating layer made up of silicon, dioxide inside as the semiconductor substrate makes it easier to stop grinding just before the insulating layer because silicon dioxide is harder and accordingly more difficult to grind than silicon is.

It is also preferable to bond the first semiconductor substrate to the second semiconductor substrate and the second semiconductor substrate to the third semiconductor substrate by injecting a fluid adhesive into the gaps between the semiconductor substrates, and an epoxy adhesive is particularly preferable as the fluid adhesive.

The use of a fluid adhesive for bonding the semiconductor substrates together make possible uniform injection of an adhesive between the semiconductor substrates. Among fluid adhesives, epoxy fluid adhesives are highly unlikely to generate bubbles, which would adversely affect the electrical performance of the three-dimensional semiconductor integrated circuit apparatus.

In order to achieve the intentions of the invention, by a second manufacturing method for three-dimensional semiconductor integrated circuit apparatuses according to still another aspect of the invention, a first semiconductor substrate over whose surface layer is formed a first integrated circuit and a second semiconductor substrate over whose surface layer is formed a second integrated circuit are bonded together with their respective integrated circuit sides positioned opposite to each other so that the first integrated circuit and the second integrated circuit be electrically connected; the back side of the second semiconductor substrate is grounded to expose the embedded wiring; on the second semiconductor substrate is formed the embedded wiring of which one end is electrically connected to at least either one of the first integrated circuit or the second integrated circuit and the other end is exposed on the back side of the second semiconductor substrate; and the integrated circuit side of a third semiconductor substrate over whose surface layer is formed a third integrated circuit is bonded to the back side of the second semiconductor substrate so that the third integrated circuit be electrically connected to the exposed part of the embedded wiring.

In this second manufacturing method for three-dimensional semiconductor integrated circuit apparatuses according to the invention, as it enables without having to use a supporting substrate or the like a first semiconductor substrate over whose surface layer is formed a first integrated circuit and a second semiconductor substrate over whose surface layer is formed a second integrated circuit to be directly bonded together with their respective integrated circuit sides positioned opposite to each other so that the first integrated circuit and the second integrated circuit be electrically connected, a step of bonding the substrates to a supporting substrate and one of removing them from the supporting substrate is dispensed with, making it possible to substantially simplify the manufacturing process. Moreover, as the embedded wiring penetrates the substrate, the substrate can be made reasonably thick.

Furthermore, according to the invention, a three-dimensional semiconductor integrated circuit apparatus can be manufactured in such a simple and easy process of bonding, grinding and forming embedded wiring that the embedded wiring of which one end is electrically connected to at least either one of the first and second integrated circuits and the other end is exposed on the back side of the second semiconductor substrate is formed and the integrated circuit side of the third semiconductor substrate over whose surface layer is formed the third integrated circuit is bonded to the back side of the second semiconductor substrate so that the third integrated circuit be electrically connected to the exposed part of the embedded wiring.

To add, by further grinding the back side of the third semiconductor substrate to form over the third semiconductor substrate the embedded wiring of which one end is electrically connected at least one of the first, second and third integrated circuits and the other end is exposed on the back side of the third semiconductor substrate, and bonding the integrated circuit side of a fourth semiconductor substrate over whose surface layer is formed a fourth integrated circuit to the back side of the third semiconductor substrate so that the fourth integrated circuit be electrically connected to the exposed part of the embedded wiring, a four-layered three-dimensional semiconductor integrated circuit apparatus can be manufactured, and by repeating this process a three-dimensional semiconductor integrated circuit apparatus of a structure having five or more layers can be manufactured.

It is preferable that the second semiconductor substrate be a silicon substrate having an insulating layer made up of silicon dioxide inside and the back side of the second semiconductor substrate be ground to the insulating layer. The use of an insulating layer made up of silicon dioxide inside as the semiconductor substrate makes it easier to stop grinding just before the insulating layer because silicon dioxide is harder and accordingly more difficult to grind than silicon is.

It is further preferable that the embedded wiring penetrate an insulator region provided in the second semiconductor substrate. The formation of the embedded wiring to penetrate the second semiconductor substrate eliminates the need to form a separate insulating layer because in this way the embedded wiring will have an insulator region around it.

BRIEF DESCRIPTION OF THE DRAWINGS

Preferred embodiments of the present invention will be described in detail below with reference to the accompanying drawings, wherein.

DETAILED DESCRIPTION OF THE PREFERRED EMBODIMENTS

The three-dimensional semiconductor integrated circuit apparatuses, which are preferred embodiments of the present invention will be described in specific details below with reference to the accompanying drawings.

Figure 1:
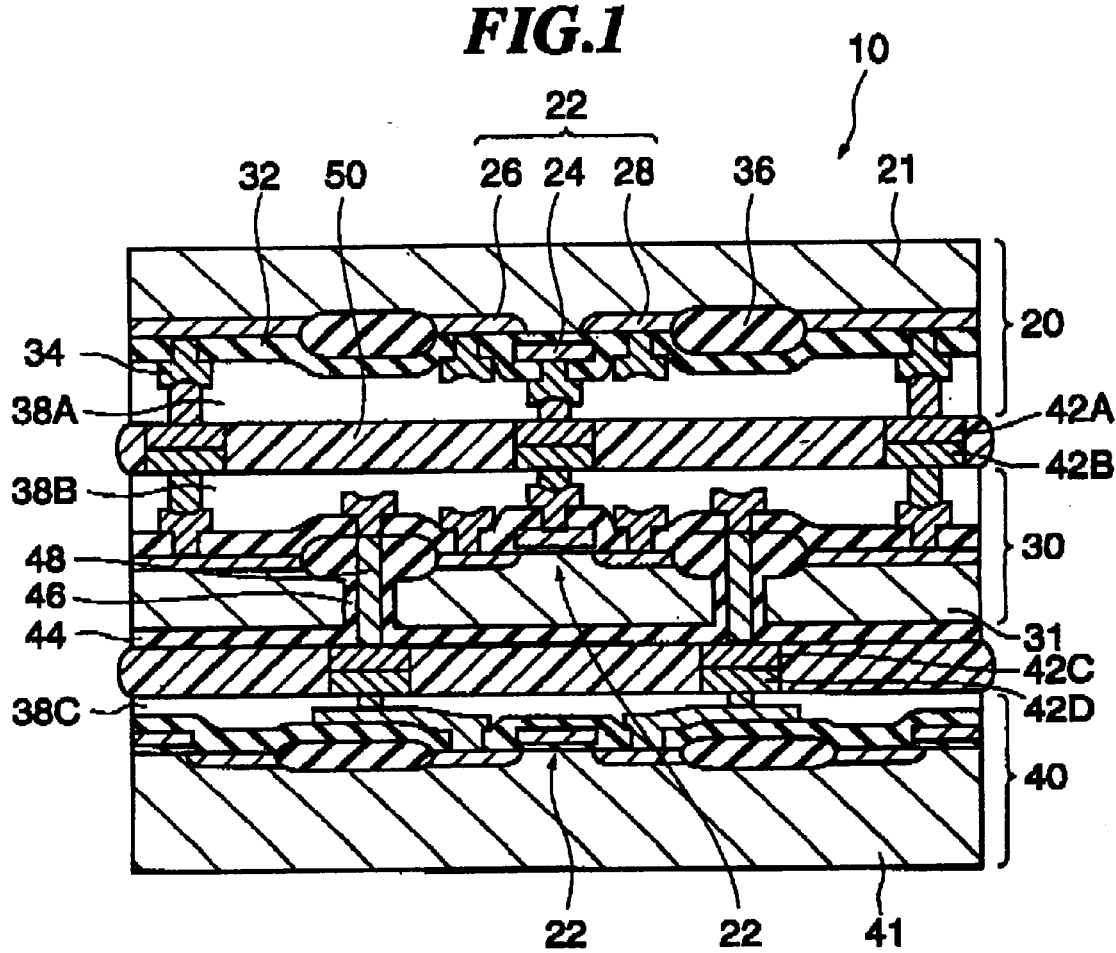
FIG. 1 is a schematic cross section of the configuration of a three-dimensional semiconductor integrated circuit apparatus, which is a preferred embodiment of the invention.

The three-dimensional semiconductor integrated circuit apparatus 10 in an embodiment according to the present invention, as illustrated in FIG. 1, is provided with three semiconductor substrates including a first semiconductor substrate 20, a second semiconductor substrate 30 and a third semiconductor substrate 40, wherein the second semiconductor substrate 30 is stacked over the third semiconductor substrate 40, and the first semiconductor substrate 20 is stacked over the second semiconductor substrate 30.

The first semiconductor substrate 20 has a silicon substrate 21 and a first integrated circuit including plural MOSFETs 22 (only one of which is illustrated for this embodiment) formed over the silicon substrate 21, and each of the MOSFETs 22 has a gate 24, a source 26 and a drain 28. The gate 24, the source 26 and the drain 28 of each MOSFET 22 are insulated from each other by an insulating film 32, and electrically connected to aluminum wiring 34. Adjoining MOSFETs 22 are separated from each other by an element separating film 36 made up of silicon dioxide.

An insulating film 38A made up of polyimide, provide over the first integrated circuit, serves to flatten the surface of the first semiconductor substrate 20. Over the surface of the first semiconductor substrate 20 on the integrated circuit side are formed micro-bumps 42A, made up of an alloy of, for instance, gold and indium, or a metallic element such as indium, and the micro-bumps 42A are electrically connected to the aluminum wiring 34 within the first silicon substrate 20. Although polyimide is used for the insulating film 38A in this embodiment, some other insulating organic material or insulating inorganic material may be used as well.

The second semiconductor substrate 30 has a silicon substrate 31, on whose back side an insulating layer 44 is formed, and a second integrated circuit including plural MOSFETs 22 (only one of which is illustrated for this embodiment) formed over the silicon substrate 31, and each of the MOSFETs 22 has a gate 24, a source 26 and a drain 28. The gate 24, the source 26 and the drain 28 of each MOSFET 22 are insulated from each other by an insulating film 32, and electrically connected to aluminum wiring 34. Adjoining MOSFETs 22 are separated from each other by an element separating film 36 made of silicon dioxide.

An insulating film 38B made up of polyimide, provided over the second integrated circuit, serves to flatten the surface of the second semiconductor substrate 30. Over the surface of the second semiconductor substrate 30 on the integrated circuit side are formed micro-bumps 42B, made up of an alloy of, for instance, gold and indium, a metallic element such as indium, and the micro-bumps 42B are electrically connected to the aluminum wiring 34 within the second silicon substrate 30. Although polyimide is used for the insulating film 38B in this embodiment, some other insulating organic material or insulating inorganic material may be used as well.

Between the MOSFETs in the second semiconductor substrate 30 are formed through-holes whose side wall is covered with an insulating film 46, and these through-holes are filled with an electroconductive material to form the embedded wiring 48. One end of the embedded wiring 48 is electrically connected by the aluminum wiring 34 to the second integrated circuit, and the other end is exposed from an insulating layer 44 provided on the back side. Over the back side of the second semiconductor substrate 30 are formed micro-bumps 42C, made up of an alloy of, for instance, gold and indium or a metallic element such as indium, and the micro-bumps 42C are electrically connected to embedded wiring 48 exposed on the back side of the second silicon substrate 30. Incidentally, a metal having a high melting point, such as polycrystalline silicon or tungsten, can be used as the electroconductive material for embedded wiring 48. For instance, polycrystalline silicon doped with impurities, having a low resistance of 0.4 mΩ/cm, can be suitably used.

The third semiconductor substrate 40 has a silicon substrate 41 and a third integrated circuit including plural MOSFETs 22 formed over the silicon substrate 41. The gate 24, the source 26 and the drain 28 of each MOSFET 22 are insulated from each other by an insulating film 32, and electrically connected to the aluminum wiring 34. Adjoining MOSFETs 22 are separated from each other by an element separating film 36 made up of silicon dioxide.

An insulating film 38C made up of polyimide, provided over the third integrated circuit, serves to flatten the surface of the third semiconductor substrate 40. Over the surface of the third semiconductor substrate 40 on the integrated circuit side are formed micro-bumps 42D, made up of an alloy of, for instance, gold and indium, or a metallic element such as indium, and the micro-bumps 42D are electrically connected to the aluminum wiring 34 within the third silicon substrate 40. Although polyimide is used for the insulating film 38C in this embodiment, some other insulating organic material or insulating inorganic material may be used as well.

The micro-bumps 42A provided on the integrated circuit side of the first semiconductor substrate 20 and the micro-bumps 42B provided on the integrated circuit side of the second semiconductor substrate 30 overlap each other in contact; gaps between substrates are filled with epoxy resin 50; and the integrated circuit side of the second semiconductor substrate 30 is bonded to the integrated circuit side of the first semiconductor substrate 20.

The micro-bumps 42C provided on the integrated circuit side of the second semiconductor substrate 30 and the micro-bumps 42D provided on the integrated circuit side so the third semiconductor substrate 40 overlap each other in contact; gaps between substrates are filled with epoxy resin 50; and the integrated circuit side of the third semiconductor substrate 40 is bonded to the back side of the second semiconductor substrate 30.

The three-dimensional semiconductor integrated circuit apparatus 10 in this embodiment can be manufactured in the following process.

First the first semiconductor substrate 20 and the second semiconductor substrate 30 are fabricated in parallel.

In order to fabricate the second semiconductor substrate 30, a silicon substrate 31 is prepared, which has MOSFETs 22 formed over an SOI substrate, within which an insulating layer 44 made up of silicon dioxide is formed by ion implantation, each provided with a gate 24, a source 26 and a drain 28, insulated by the insulating film 32, and adjoining MOSFETs 22 are separated from each other by the element separating film 36 made up of silicon dioxide. The parts of the insulating film 32 over the gate 24, the source 26 and the drain 28 are provided with contact holes for drawing out electrodes.

Between two adjoining MOSFETs of the silicon substrate 31 is provided by plasma etching a trench (deep groove) whose bottom is in a deeper position than the insulating layer 44, and the side walls of this trench are oxidized to form through-holes whose side walls are covered with the insulating film 46. These through-holes are filled with an electroconductive material to form embedded wiring 48.

Over the silicon substrates 13 over which the MOSFETs 22 are formed, an aluminum film, which is to serve as wiring, is formed by sputtering to fill the contact holes. This aluminum film is worked upon by photolithography to form the aluminum wiring 34 shaped in a prescribed pattern. This results in the formation of the second integrated circuit over the surface layer of the second semiconductor substrate 30.

Figure 2:
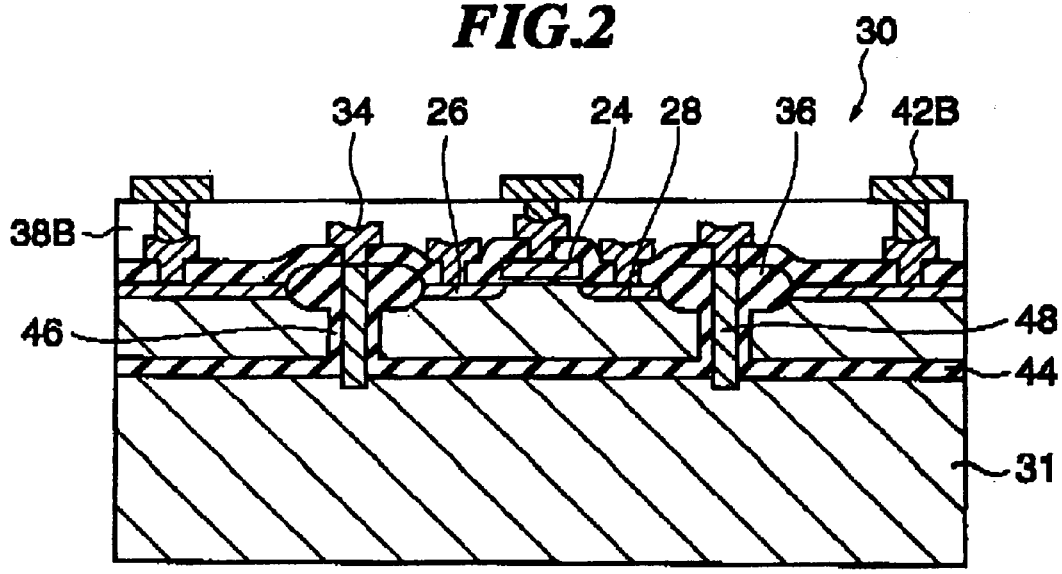
FIG. 2 is a schematic cross section illustrating a manufacturing method for the three-dimensional semiconductor integrated circuit apparatus in this embodiment of the invention.

Over the second integrated circuit so formed, the insulating film 38B made up of polyimide is stacked to cover the second integrated circuit to flatten the integrated circuit side of the second semiconductor substrate 30. Using a resist mask, an opening is bored in the insulating film 38B by reactive ion etching, and a part of the aluminum wiring 34 covered by the insulating film 38B is extended and exposed on the surface. Finally, micro-bumps 42B are formed over the integrated circuit side so as to bring them into contact with the exposed aluminum wiring 34 by lift-off using the resist mask to obtain the second semiconductor substrate 30 illustrated in FIG. 2.

Next, in order to fabricate the first semiconductor substrate 20, the silicon substrate 21 is prepared, which has MOSFETs 22 formed over a substrate, each provided with a gate 24, a source 26 and a drain 28, insulated by the insulating film 32, and adjoining MOSFETs 22 are separated from each other by the element separating film 36 made up of silicon dioxide. The insulating film 32 over the gate 24, the source 26 and the drain 28 is provided with contact holes for drawing out electrodes.

Over the silicon substrate 21 over which the MOSFETs 22 are formed, an aluminum film, which is to serve as wiring, is formed by sputtering to fill the contact holes. This aluminum film is worked upon by photolithography to form the aluminum wiring 34 shaped in a prescribed pattern. This results in the formation of the first integrated circuit over the surface layer of the first semiconductor substrate 20.

Over the first integrated circuit so formed, the insulating film 38A made up of polyimide is stacked to cover the first integrated circuit to flatten the integrated circuit side of the first semiconductor substrate 20. An opening is bored in the insulating film 38A, and a part of the aluminum wiring 34 covered by the insulating film 38A is extended and exposed on the surface. Finally, micro-bumps 42A are formed over the integrated circuit side so as to bring them into contact with the exposed aluminum wiring 34 by lift-off using the resist mask to obtain the first semiconductor substrate 20.

Figure 3:
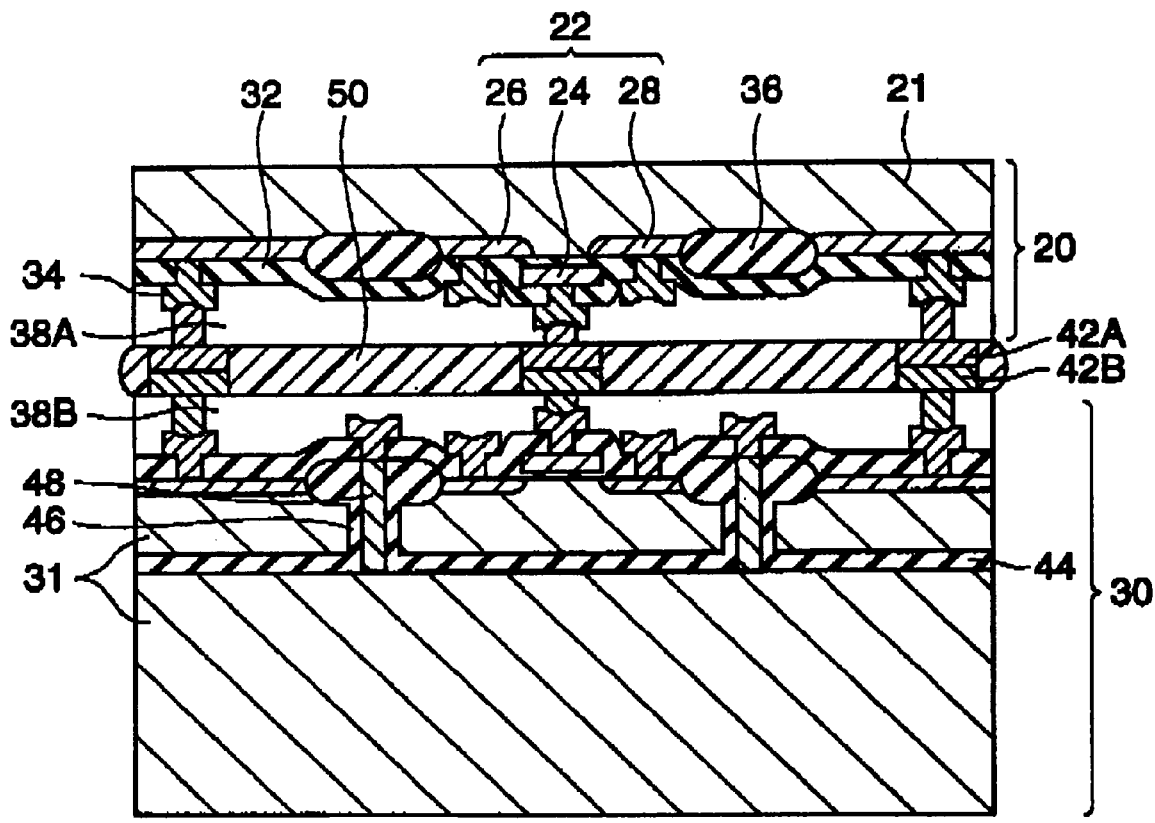
FIG. 3 is another schematic cross section illustrating the manufacturing method for the three-dimensional semiconductor integrated circuit apparatus in this embodiment of the invention.

Then, as illustrated in FIG. 3, the integrated circuit side of the second semiconductor substrate 30 is bonded to the integrated circuit side of the first semiconductor substrate 20 to electrically connect the first integrated circuit and the second integrated circuit.

The first semiconductor substrate 20 is placed to overlap the second semiconductor substrate 30 as to bring the micro-bumps 42A provided over the integrated circuit side of the first semiconductor substrate 20 and the micro-bumps 42B provided over the integrated circuit side of the second semiconductor substrate 30 into contact with each other and, in order to strengthen the tacking of the micro-bumps 42A and the micro-bumps 42B, pressure is uniformly applied between the substrates while monitoring the pressure with a load cell. The positioning of the first semiconductor substrate 20 and the second semiconductor substrate 30 is accomplished with a positioning apparatus using infrared rays capable of passing silicon substrates.

The tacked first semiconductor substrate 20 and second semiconductor substrate 30, together with a vessel containing fluid epoxy resin, is put into a chamber permitting adjustment of the atmospheric pressure within, the inside of the chamber is vacuumized, and the tacked first semiconductor substrate 20 and second semiconductor substrate 30 are partly dipped in the fluid epoxy resin. After that, the inside atmospheric pressure is returned to normal level, and the fluid epoxy resin 50 is injected into the gaps between the substrates where micro-bumps are absent. After lifting the substrates, the epoxy resin 50 is hardened, and the integrated circuit side of the second semiconductor substrate 30 is bonded to the integrated circuit side of the first semiconductor substrate 20.

Figure 4:
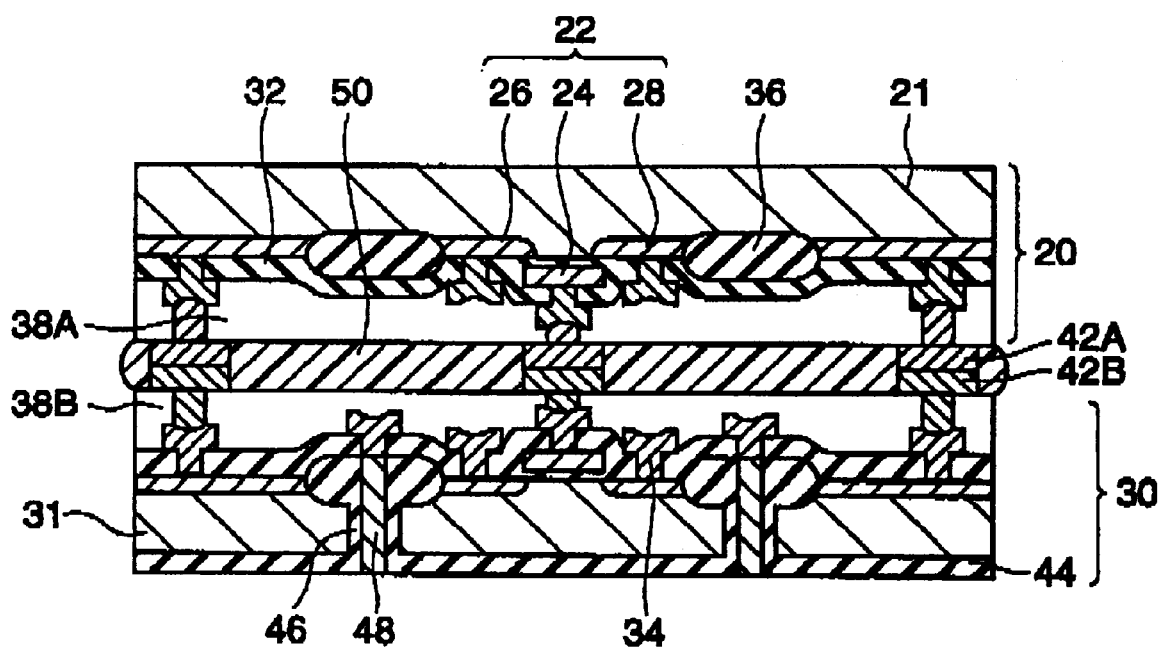
FIG. 4 is still another schematic cross section illustrating the manufacturing method for the three-dimensional semiconductor integrated circuit apparatus in this embodiment of the invention.

Next, as illustrated in FIG. 4, the second semiconductor substrate 30 is ground on the back side to expose the embedded wiring 48.

Figure 8:
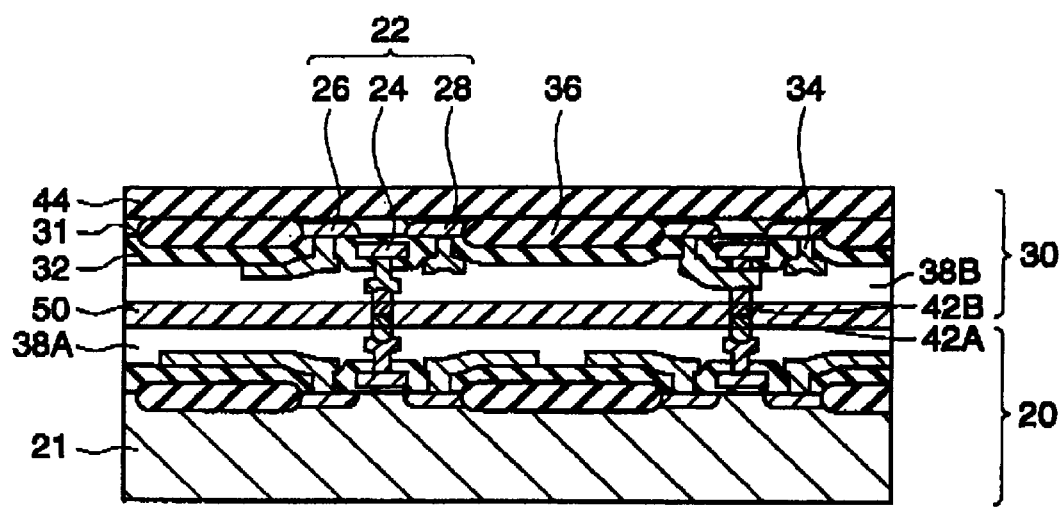
FIG. 8 is another schematic cross section illustrating the manufacturing method for the three-dimensional semiconductor integrated circuit apparatus in this alternative embodiment of the invention.

The second semiconductor substrate 30 after its bonding to the first integrated circuit 20 is ground chemico-mechanically on the back side to a uniform thickness. As silicon dioxide that constitutes the insulating layer 44 is more resistant to grinding than silicon is, the grinding is stopped just before the insulating layer 44 as shown in FIG. 8, and the embedded wiring 48 formed more deeply than the insulation layer 44 is exposed out of the insulation layer 44. The micro-bumps 42C are formed on the back side surface of the second semiconductor substrate 30 by lift-off using the resist mask so as to contact the exposed embedded wiring 48.

Next, in order to fabricate the third semiconductor substrate 40, the silicon substrate 41 is prepared, which has MOSFETs 22 formed over a substrate, each provided with a gate 24, a source 26 and a drain 28, insulated by the insulating film 32, and adjoining MOSFETs 22 are separated from each other by the element separating film 36 made up of silicon dioxide. The insulating film 32 over the gate 24, the source 26 and the drain 28 is provided with contact holes for drawing out electrodes.

Over the silicon substrate 41 over which the MOSFETs 22 are formed, an aluminum film, which is to serve as wiring, is formed by sputtering to fill the contact holes. This aluminum film is worked upon by photolithography to form the aluminum wiring 34 shaped in a prescribed pattern. This results in the formation of the third integrated circuit over the surface layer of the third semiconductor substrate 40.

Over the third integrated circuit so formed, the insulating film 38C made up of polyimide is stacked to cover the third integrated circuit to flatten the integrated circuit side of the third semiconductor substrate 40. An opening is board in the insulating film 38C, and a part of the aluminum wiring 34 covered by the insulating film 38C is extended and exposed on the surface. Finally, micro-bumps 42C are formed over the integrated circuit side so as to bring them into contact with the exposed aluminum wiring 34 by lift-off using the resist mask to obtain the third semiconductor substrate 40.

Next, the integrated circuit surface of the third semiconductor substrate 40 is bonded to the back side of the second semiconductor substrate 30 so as to electrically connect the third integrated circuit to the exposed part of the embedded wiring 48 to obtain the three-dimensional semiconductor integrated circuit apparatus 10 illustrated in FIG. 1.

The second semiconductor substrate 30 is placed to overlap the third semiconductor substrate 40 so as to bring the micro-bumps 42C provided over the back side of the second semiconductor substrate 30 and the micro-bumps 42D provided over the integrated circuit side of the third semiconductor substrate 40 into contact with each other and, in order to strengthen the tacking of the micro-bumps 42C and the micro-bumps 42D, pressure is uniformly applied between the substrates while monitoring the pressure with a load cell.

Fluid epoxy resin is injected into the gaps between second semiconductor substrate 30 and the third semiconductor substrate 40, and the epoxy resin 50 is hardened to stick the integrated circuit side of the third semiconductor substrate 40 to the back side of the second semiconductor substrate 30. The methods of positioning and bonding the second semiconductor substrate 30 and the third semiconductor substrate 40 are the same as those for the first semiconductor substrate 20 and the second semiconductor substrate 30.

Although the foregoing embodiment of the invention is a three-layered three-dimensional semiconductor integrated circuit apparatus in which a substrate having no embedded wiring needed for connection between substrates in the longitudinal direction is used as the semiconductor substrate, it is also possible to stack a fourth semiconductor substrate by using as the third semiconductor substrate a substrate which, like the second semiconductor substrate, has a third integrated circuit formed over the surface layer and embedded wiring of which one end is electrically connected to the third integrated circuit and the other end is exposed on the back side, and bonding the integrated circuit side of the third semiconductor substrate to the back side of the second semiconductor substrate so as to electrically connect the third integrated circuit to the embedded wiring of the second semiconductor substrate, thereby making it possible to stack a fourth semiconductor substrate and thereby to obtain a three-dimensional semiconductor substrate circuit apparatus having a structure of four or more layers.

Figure 5:
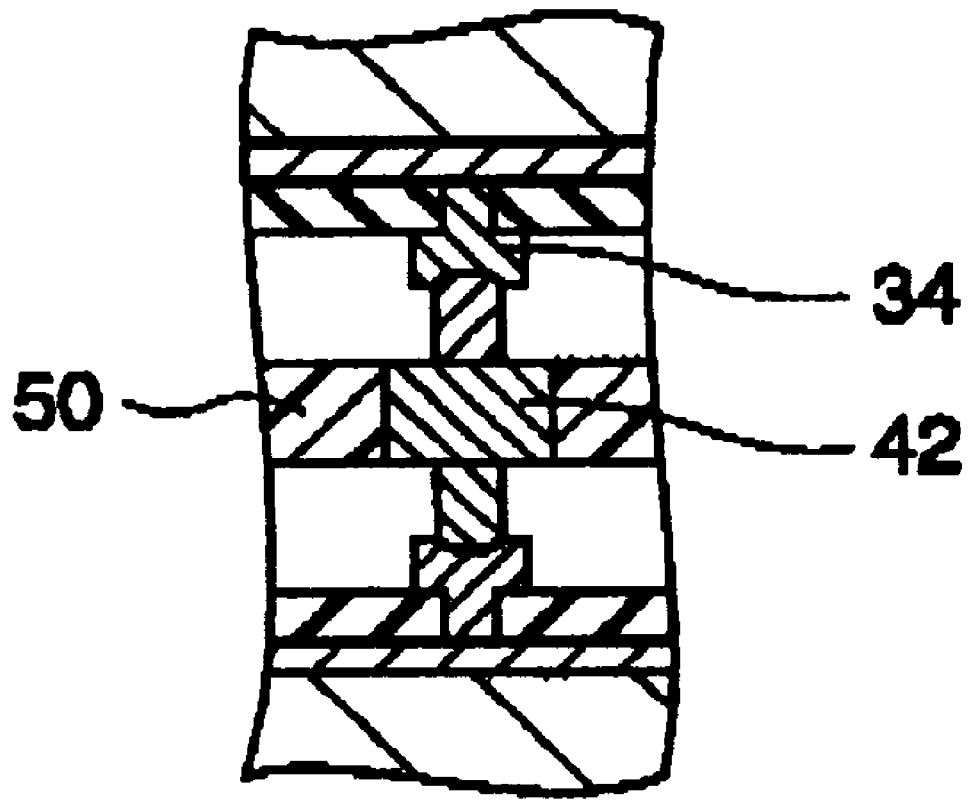
FIG. 5 partially illustrates a variation of the contact part of the three-dimensional semiconductor integrated circuit apparatus in this embodiment of the invention.

Although in the foregoing embodiment the first integrated circuit and the second integrated circuit are electrically connected via micro-bumps, and so are the third integrated circuit and the end of the embedded wiring of the second semiconductor substrate, they may as well be electrically connected by some other contact members. Though in this embodiment micro-bumps are formed on both surfaces of the semiconductor substrates and the two semiconductor substrates are bonded together so that opposite micro-bumps overlap each other, electrical connection may be accomplished by micro-bumps on only one side as illustrated in FIG. 5, so that micro-bumps need to be formed on only one of the substrates.

Although in this embodiment a silicon substrate into which the insulating layer 44 made up of silicon dioxide within the substrate is used as the silicon substrate for use in the second semiconductor substrate to be ground, a silicon substrate having no insulating layer 44 made up of silicon dioxide may as well be used.

The silicon substrate for use in this embodiment may be on either wafer scale or a chip scale.

Next will be described in specific detail another manufacturing method for three-dimensional semiconductor integrated circuit apparatuses pertaining to the present invention with reference to FIGS. 6 through 11. FIGS. 6 through 11 are cross sectional views illustrating the manufacturing method for the three-dimensional semiconductor integrated circuit apparatus 10.

Figure 7:
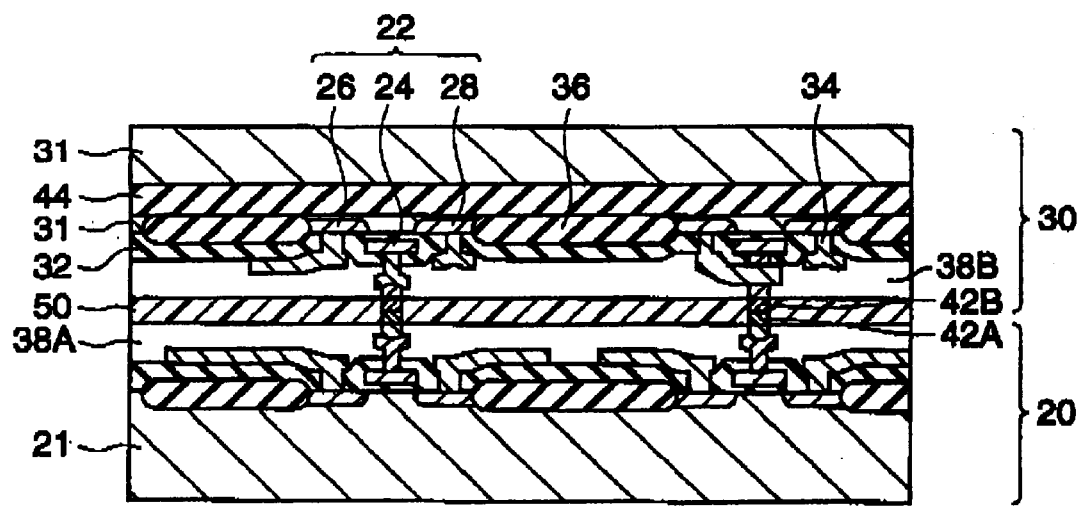
FIG. 7 is a schematic cross section illustrating a manufacturing method for the three-dimensional semiconductor integrated circuit apparatus in this alternative embodiment of the invention.

First as shown in FIG. 7, the first semiconductor substrate 20 having an integrated circuit formed over the silicon substrate 21 and the second semiconductor substrate 30 having an integrated circuit formed over an SOI substrate are bonded so as to position the surfaces of the integrated circuit opposite to each other.

In order to fabricate the first semiconductor substrate 20, the silicon substrate 21 is prepared, which has plural MOSFETs 22 (for this embodiment two MOSFETs are shown) formed over a substrate, each provided with a gate 24, a source 26 and a drain 28, insulated by the insulating film 32, and adjoining MOSFETs 22 are separated from each other by the element separating film 36 made up of silicon dioxide. The insulating film 32 over the gate 24, the source 26 and the drain 28 is provided with contact holes for drawing out electrodes.

Over the silicon substrate 21 over which the MOSFETs 22 are formed, an aluminum film, which is to serve as wiring, is formed by sputtering to fill the contact holes. This aluminum film is worked upon by photolithography to form the aluminum wiring 34 shaped in a prescribed pattern. This results in the formation of the first integrated circuit over the surface layer of the first semiconductor substrate 20.

Over the first integrated circuit so formed, the insulating film 38A made up of silicon dioxide is stacked to cover the first integrated circuit to flatten the integrated circuit side of the first semiconductor substrate 20. An opening is bored in the insulating film 38A, and a part of the aluminum wiring 34 covered by the insulating film 38 is extended and exposed on the surface. Finally, over the integrated circuit side are formed micro-bumps 42A, made up of an alloy of, for instance, gold and indium, or a metallic element such as indium, so as to be electrically connected to the aluminum wiring 34 by lift-off using the resist mask to obtain the first semiconductor substrate 20. Although silicon dioxide is used for the insulating film 38A in this embodiment, some other insulating inorganic material or insulating organic material such as polyimide may be used as well.

In order to fabricate the second semiconductor substrate 30, the silicon substrate 31 is prepared, which has plural MOSFETs 22 (for this embodiment two MOSFETs are shown) formed over an SOI substrate having an insulating layer 44 made up of silicon dioxide, each provided with a gate 24, a source 26 and a drain 28, insulated by the insulating film 32, and adjoining MOSFETs 22 are separated from each other by the element separating film 36 made up of silicon dioxide. The insulating film 32 over gate 24, the source 26 and the drain 28 is provided with contact holes for drawing out electrodes.

Over the silicon substrate 31 over which the MOSFETs 22 are formed, an aluminum film, which is to serve as wiring is formed by sputtering to fill the connect holes. This aluminum film is worked upon by photolithography to form the aluminum wiring 34 shaped in a prescribed pattern. This result in the formation of the second integrated circuit over the surface layer of the second semiconductor substrate 30.

Over the second integrated circuit so formed, the insulating film 38B made up of silicon dioxide is stacked to cover the second integrated circuit to flatten the integrated circuit side of the second semiconductor substrate 30. An opening is bored in the insulating films 38B reactive ion etching, and a part of the aluminum wiring 34 covered by the insulating film 38 is extended and exposed on the surface. Finally, over the integrated circuit side are formed micro-bumps 42B, made up of an alloy of, for instance, gold and indium, or a metallic element such as indium, so as to be electrically connected to the aluminum wiring 34 by lift-off using the resist mask to obtain the second semiconductor substrate 30. Although silicon dioxide is used for the insulating film 38B in this embodiment, some other insulating inorganic material or insulating organic material such as polyimide may be used as well.

Figure 6:
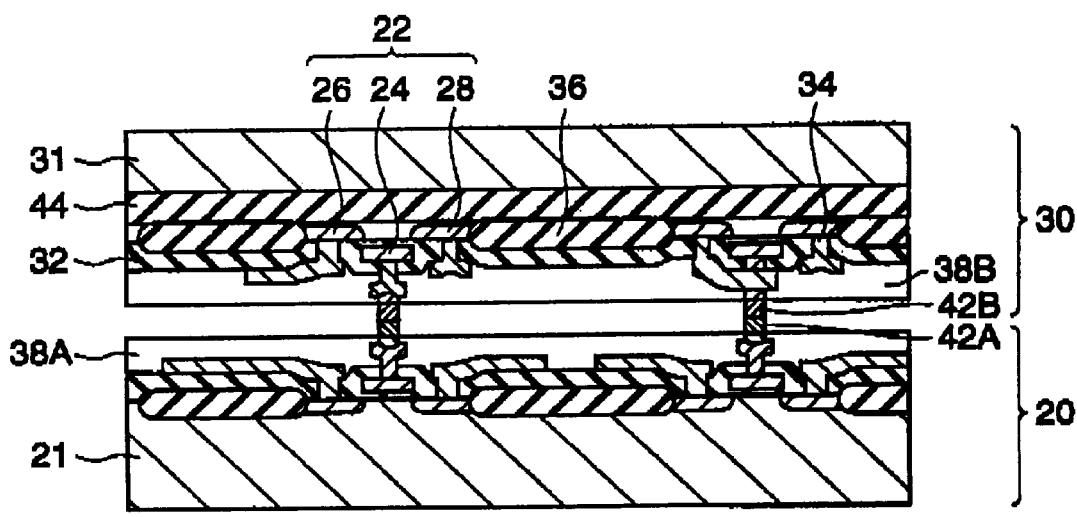
FIG. 6 is a schematic cross section of the configuration of a three-dimensional semiconductor integrated circuit apparatus, which is an alternative preferred embodiment of the invention.

As shown in FIG. 6, the first semiconductor substrate 40 is placed to overlap the second semiconductor substrate 30 so as to bring the micro-bumps 42A provided over the integrated circuit side of the first semiconductor substrate 20 and the micro-bumps 42B provided over the integrated circuit side of the second semiconductor substrate 30 into contact with each other and, in order to strengthen the tacking of the micro-bumps 42A and the micro-bumps 42B, pressure is uniformly applied between the substrates while monitoring the pressure with a load cell. The positioning of the first semiconductor substrate 20 and the second semiconductor substrate 30 is accomplished with a positioning apparatus using infrared rays capable of passing silicon substrates.

The tacked first semiconductor substrate 20 and second semiconductor substrate 30, together with a vessel containing fluid epoxy resin, is put into a chamber permitting adjustment of the atmospheric pressure within, the inside of the chamber is vacuumized, and the tacked first semiconductor substrate 20 and second semiconductor substrate 30 are partly dipped in the fluid epoxy resin. After that, the inside atmospheric pressure is returned to the normal level, and the fluid epoxy resin 50 is injected into the gaps between the substrates where micro-bumps are absent. After lifting the substrates, the epoxy resin 50 is hardened, and the integrated circuit side of the second semiconductor substrate 30 is bonded to the integrated circuit side of the first semiconductor substrate 20 as illustrated in FIG. 7.

Next, the second semiconductor substrate 30 is ground on the back side into a thin film.

The second semiconductor substrate 30 after its bonding to the first integrated circuit 20 is ground chemico-mechanically on the back side to a uniform thickness. As silicon dioxide that constitutes the insulating layer 44 is more resistant to grinding than silicon is, the grinding is stopped just before the insulating layer 44 as shown in FIG. 8, and the embedded wiring 48 is exposed. In this process, the first semiconductor substrate 20 serves as a supporting substrate, but it is not removed subsequently.

Figure 9:
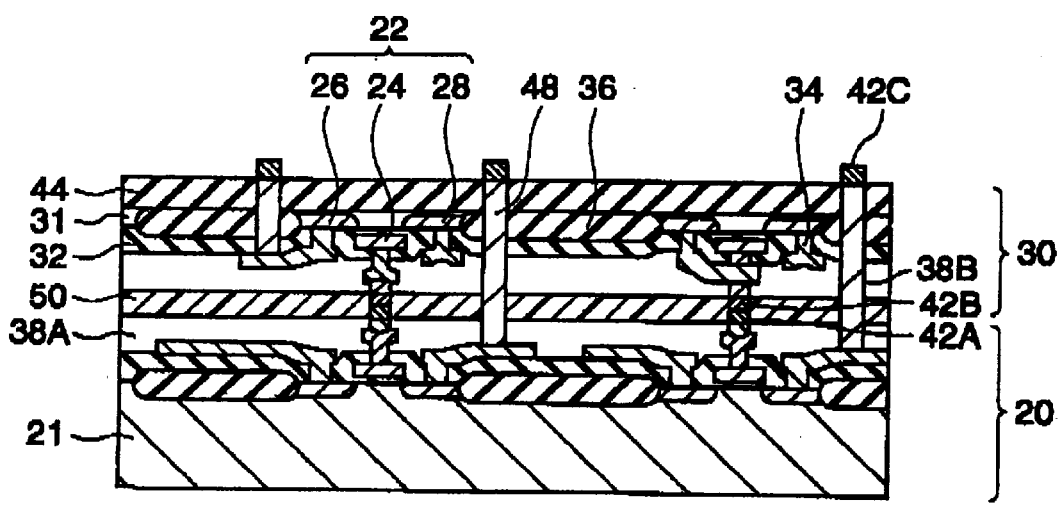
FIG. 9 is another schematic cross section illustrating the manufacturing method for the three-dimensional semiconductor integrated circuit apparatus in this alternative embodiment of the invention.

Then, between two adjoining MOSFETs of the second semiconductor substrate 30 and in an insulator region in which the insulating layer 44 and the element separating film 36 are provided without space therebetween, there is provided by plasma etching a trench (deep groove) extending from the back side of the second semiconductor substrate 30 to the first semiconductor substrate or the aluminum wiring 34 of the second semiconductor substrate 30. As shown in FIG. 9, this trench is filled with a metal having a high melting point, such as tungsten, as an electroconductive material to form embedded wiring 48. Over the back side of the second semiconductor substrate 30 micro-bumps 42C, made up of an alloy of, for instance, gold and indium, or a metallic element such as indium, are formed by lift-off using the resist mask so as to come into contact with the embedded wiring 48 exposed on the back side.

Figure 10:
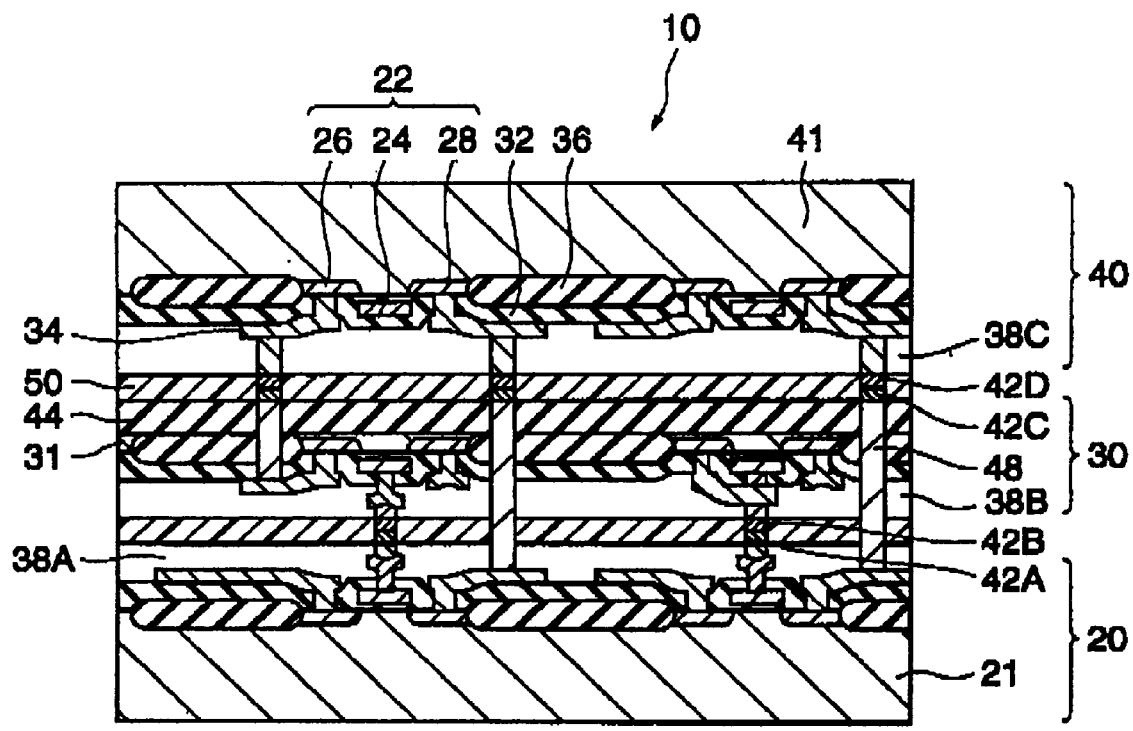
FIG. 10 is yet another schematic cross section illustrating the manufacturing method for the three-dimensional semiconductor integrated circuit apparatus in this alternative embodiment of the invention.

Next, as shown in FIG. 10, the integrated circuit surface of the third semiconductor substrate 40 is bonded to the back side of the second semiconductor substrate 30 so as to electrically connect the third integrated circuit to the exposed part of the embedded wiring 48.

In order to fabricate the third semiconductor substrate 40, the silicon substrate 41 is prepared, which has plural MOSFETs 22 (for this embodiment three MOSFETs are shown) formed over a substrate, each provided with a gate 24, a source 26 and a drain 28, insulated by the insulating film 32, and adjoining MOSFETs 22 are separated from each other by the element separating film 36 made up of silicon dioxide. The insulating film 32 over the gate 24, the source 26 and the drain 28 is provided with contact holes for drawing out electrodes.

Over the silicon substrate 41 over which the MOSFETs 22 are formed, an aluminum film, which is to serve as wiring, is formed by sputtering to fill the contact holes. This aluminum film is worked upon by photolithography to form the aluminum wiring 34 shaped in a prescribed pattern. This results in the formation of the third integrated circuit over the surface layer of the third semiconductor substrate 40.

Over the third integrated circuit so formed, the insulating film 38C made up of silicon dioxide is stacked to cover the third integrated circuit to flatten the integrated circuit side of the third semiconductor substrate 40. An opening is bored in the insulating film 38C, and a part of the aluminum wiring 34 covered by the insulating film 38 is extended and exposed on the surface. Finally, over the integrated circuit side are formed micro-bumps 42D, made up of an alloy of, for instance, gold and indium, or a metallic element such as indium, so as to be electrically connected to the aluminum wiring 34 by lift-off using the resist mask to obtain the third semiconductor substrate 40. Although silicon dioxide is used for the insulating film 38C in this embodiment, some other insulating inorganic material or insulating organic material such as polyimide may be used as well.

The second semiconductor substrate 30 is placed to overlap the third semiconductor substrate 40 so as to bring the micro-bumps 42C provided over the back side of the second semiconductor substrate 30 and the micro-bumps 42D provided over the integrated circuit side of the third semiconductor substrate 40 into contact with each other and, in order to strengthen the tacking of the micro-bumps 42C and the micro-bumps 42D, pressure is uniformly applied between the substrates while monitoring the pressure with a load cell.

Fluid epoxy resin 50 is injected into the gaps between the tacked second semiconductor substrate 30 and third semiconductor substrate 40, the epoxy resin 50 is hardened, and the integrated circuit side of the third semiconductor substrates 40 is bonded to the back side of the second semiconductor substrate 30. The methods of positioning and bonding the second semiconductor substrate 30 and the third semiconductor substrate 40 are the same as those for the first semiconductor substrate 20 and the second semiconductor substrate 30.

The foregoing process can give the three-dimensional semiconductor integrated circuit apparatus 10 made up of three semiconductor substrates including the first semiconductor substrate 20, the second semiconductor substrate 30 and the third semiconductor substrate 40, wherein the second semiconductor substrate 30 is stacked over the first semiconductor substrate 20 and the third semiconductor substrate 40 is stacked over the second semiconductor substrate 30.

Although the description of this embodiment refers to a case in which a three-layered three-dimensional semiconductor integrated circuit apparatus is to be fabricated using a silicon substrate having no insulating layer made up of silicon dioxide as the third semiconductor substrate, it is made possible further to stack a fourth semiconductor substrate and thereby to obtain a three-dimensional semiconductor integrated circuit apparatus having a structure of four or more layers by the formation of embedded wiring in the third semiconductor substrate after grinding the third semiconductor substrate on the back side. In this case, the use of a silicon substrate having an insulating layer made up of a silicon dioxide within as the third semiconductor substrate facilitates the grinding of and the formation of embedded wiring within the third semiconductor substrate.

Although the foregoing embodiment uses, as the silicon substrate for use in the second semiconductor substrate to be ground, a silicon substrate having an insulating layer made up of silicon dioxide formed within, it is also acceptable to use a silicon substrate having no insulating layer made up of silicon dioxide within.

Figure 11:
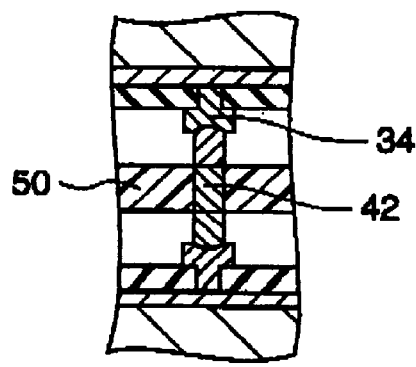
FIG. 11 partially illustrates a variation of the contact part of the three-dimensional semiconductor integrated circuit apparatus in this alternative embodiment of the invention.

Although in the foregoing embodiment the first integrated circuit and the second integrated circuit are electrically connected via micro-bumps, and so are the third integrated circuit and the end of the embedded wiring of the second semiconductor substrate, they may as well be electrically connected by some other contact members. Though in this embodiment micro-bumps are formed on both bonded together so that opposite micro-bumps overlap each other, electrical connection may be accomplished by micro-bumps on only one side as illustrated in FIG. 11, so that micro-bumps need to be formed on only one of the substrates.

The silicon substrates for use in this embodiment may be on either a wafer scale or a chip scale.

The three-dimensional semiconductor substrate integrated circuit apparatus according to the present invention provides the advantages of ready electrical connection and resistance to deformation. The three-dimensional semiconductor integrated circuit apparatus manufacturing method according to the invention provides the advantages of making possible the stacking of many semiconductor substrate layers in a rational, simple and easy process involving neither mounting nor dismounting of a supporting substrate and the formation of a reliable insulating film over the embedded wiring. There is the further advantage of making possible the formation of embedded wiring surrounded by a reliable insulating film by forming the embedded wiring so as to penetrate the insulator region.

What is claimed is:

1. A three-dimensional semiconductor integrated circuit apparatus comprising:
    a first semiconductor substrate on whose surface layer is formed a first integrated circuit and at least one first contact surface;
    a second semiconductor substrate on whose surface layer are formed a second integrated circuit and at least one second contact surface and embedded wiring of which one end is electrically connected to the second integrated circuit and the other end is exposed from the back side, and the second contact surface makes contact with the first contact surface of the first integrated circuit so that the first integrated circuit and the second integrated circuit be electrically connected;
    an adhesive layer that bonds the surface layer of the first semiconductor substrate to the surface layer of the second semiconductor substrate excluding the first contact surface and the second contact surface; and
    a third semiconductor substrate on whose surface layer is formed a third integrated circuit and whose integrated circuit side is bonded to the back of the second integrated circuit so that the third integrated circuit be electrically connected to the other end of the embedded wiring.

2. A three-dimensional semiconductor integrated circuit apparatus comprising:
    a first semiconductor substrate on whose surface layer is formed a first integrated circuit and at least one first contact surface;
    a second semiconductor substrate on whose surface layer are formed a second integrated circuit and at least one second contact surface and embedded wiring of which one end is electrically connected to the second integrated circuit and the other end is exposed from the back side, and the second contact surface makes contact with the first contact surface of the first integrated circuit so that the first integrated circuit and the second integrated circuit be electrically connected;
    an adhesive layer that bonds the surface layer of the first semiconductor substrate to the surface layer of the second semiconductor substrate excluding the first contact surface and the second contact surface; and
    a third semiconductor substrate on whose surface layer is formed a third integrated circuit and embedded wiring of which one end is electrically connected to the third integrated circuit and the other end is exposed from the back side, and whose integrated circuit side is bonded to the back side of the second integrated circuit so that the third integrated circuit be electrically connected to the other end of the embedded wiring of the second semiconductor substrate.

3. A three-dimensional semiconductor integrated circuit apparatus according to claim 1, wherein the first integrated circuit and the second integrated circuit are electrically connected via contact members, and so are the third integrated circuit and the other end of the embedded wiring of the second semiconductor substrate.

* * * * *

UNITED STATES PATENT AND TRADEMARK OFFICE
CERTIFICATE OF CORRECTION

PATENT NO.    : 6,525,415 B2                                              Page 1 of 1
DATED         : February 25, 2003
INVENTOR(S)   : Mitsumasa Koyanagi, Yasunori Okano and Nobuaki Miyakawa It is certified that error appears in the above-identified patent and that said Letters Patent is hereby corrected as shown below:

<u>Title page,</u>
Item [73], Assignee, change "Fuji Xerox Co., Ltd., Tokyo (JP)" to
-- Fuji Xerox Co., Ltd., Tokyo (JP) and Mitsumasa Koyanagi, Miyagi (JP) --.

Signed and Sealed this

Sixteenth Day of September, 2003

JAMES E. ROGAN
*Director of the United States Patent and Trademark Office*